(12) United States Patent
Yang et al.

(10) Patent No.: US 12,027,232 B2
(45) Date of Patent: *Jul. 2, 2024

(54) WORD LINE DRIVER CIRCUIT AND MEMORY

(71) Applicant: CHANGXIN MEMORY TECHNOLOGIES, INC., Hefei (CN)

(72) Inventors: Guifen Yang, Hefei (CN); Sungsoo Chi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 136 days.

This patent is subject to a terminal disclaimer.

(21) Appl. No.: 17/813,147

(22) Filed: Jul. 18, 2022

(65) Prior Publication Data

US 2023/0030836 A1 Feb. 2, 2023

Related U.S. Application Data

(63) Continuation of application No. PCT/CN2022/075238, filed on Jan. 30, 2022.

(30) Foreign Application Priority Data

Jul. 29, 2021 (CN) .......................... 202110864945.8

(51) Int. Cl.
G11C 8/08 (2006.01)
G11C 8/14 (2006.01)
H01L 27/02 (2006.01)

(52) U.S. Cl.
CPC .................. *G11C 8/08* (2013.01); *G11C 8/14* (2013.01); *H01L 27/0207* (2013.01)

(58) Field of Classification Search
CPC .. G11C 8/08; G11C 8/14; G11C 5/025; H01L 27/0207
See application file for complete search history.

(56) References Cited

U.S. PATENT DOCUMENTS

| 7,359,280 | B2 | 4/2008 | Chang |
| 10,490,256 | B2 | 11/2019 | Jeong |
| 10,892,004 | B2 | 1/2021 | Jeong |
| 10,957,369 | B2 | 3/2021 | Kim |
| 2006/0221702 | A1* | 10/2006 | Scheuerlein ........... G11C 5/063 365/185.23 |

(Continued)

FOREIGN PATENT DOCUMENTS

| CN | 202076002 U | 12/2011 |
| CN | 112216318 A | 1/2021 |

(Continued)

*Primary Examiner* — Khamdan N. Alrobaie
(74) *Attorney, Agent, or Firm* — Syncoda LLC; Feng Ma

(57) ABSTRACT

A word line driver circuit may at least include multiple word line drivers, each of which including a PMOS transistor and at least one NMOS transistor. The multiple word line drivers include multiple PMOS transistors and multiple NMOS transistors. The multiple PMOS transistors are arranged side by side, and in an arrangement direction of the multiple PMOS transistors, a part of the multiple NMOS transistors are located on a side of the multiple PMOS transistors, and another part of the NMOS transistors are located on another side of the multiple PMOS transistors.

20 Claims, 9 Drawing Sheets

(56) References Cited

U.S. PATENT DOCUMENTS

| | | | |
|---|---|---|---|
| 2007/0241810 A1* | 10/2007 | Onda | G11C 11/4094 |
| | | | 327/544 |
| 2011/0242882 A1* | 10/2011 | Asayama | H10B 10/12 |
| | | | 365/154 |
| 2018/0166119 A1 | 6/2018 | Jeong | |
| 2020/0051611 A1* | 2/2020 | Jeong | H01L 27/0207 |
| 2020/0411076 A1 | 12/2020 | Kim et al. | |
| 2021/0012828 A1 | 1/2021 | Kim et al. | |
| 2021/0057008 A1 | 2/2021 | Kim | |
| 2023/0031454 A1* | 2/2023 | Yang | G11C 8/14 |
| 2023/0122500 A1* | 4/2023 | Inaba | G11C 5/063 |
| | | | 257/213 |

FOREIGN PATENT DOCUMENTS

| | | |
|---|---|---|
| CN | 112420094 A | 2/2021 |
| CN | 113178217 A | 7/2021 |

* cited by examiner

WORD LINE DRIVER CIRCUIT AND MEMORY

CROSS-REFERENCE TO RELATED APPLICATION

The present application is a continuation of International Application No. PCT/CN2022/075238 filed on Jan. 30, 2022 which claims priority to Chinese Patent Application No. 202110864945.8 filed on Jul. 29, 2021. The disclosures of the above-referenced applications are hereby incorporated by reference in their entirety.

BACKGROUND

Various circuits in a memory require the use of various signals, and a signal driver for applying signals to a signal line is widely used. A word line driver is used to apply a voltage to a word line in a memory cell array, and the word line may extend from a sub word line driver (SWD) and go through the memory cell array. The sub word line driver may selectively activate a corresponding word line in response to that a storage device receives a row address corresponding to the word line, and each memory cell connected to the activated word line may output or input data.

SUMMARY

Embodiments of the present disclosure relate to, but are not limited to, a word line driver circuit and a memory.

Various embodiments of the present disclosure provide a new word line driver circuit and memory.

According to some embodiments of the present disclosure, an embodiment of the present disclosure provides a word line driver circuit including multiple word line drivers, each of the word line drivers includes a P-channel Metal Oxide Semiconductor (PMOS) transistor and at least one N-channel Metal Oxide Semiconductor (NMOS) transistor, the multiple word line drivers includes multiple PMOS transistors and multiple NMOS transistors, the multiple PMOS transistors are arranged side by side, and in an arrangement direction of the multiple PMOS transistors, a part of the multiple NMOS transistors are located on a side of the multiple PMOS transistors, and another part of the multiple NMOS transistors are located on another side of the multiple PMOS transistors.

In accordance with some embodiments of the present disclosure, an embodiment of the present disclosure further provides a memory including the word line driver circuit.

BRIEF DESCRIPTION OF THE DRAWINGS

One or more embodiments are exemplified by figures in the accompanying drawings corresponding thereto, which are not intended to limit these embodiments, unless specifically stated, the figures in the drawings do not constitute a scale limitation.

DETAILED DESCRIPTION

Embodiments of the present disclosure will now be described in detail in conjunction with the accompanying drawings. However, those of ordinary skill in the art will appreciate that, in various embodiments of the present disclosure, a number of technical details are proposed to enable the reader to better understand the present disclosure. However, the technical solution claimed in the present disclosure can be realized without these technical details and various changes and modifications based on the following embodiments.

Figure 1:
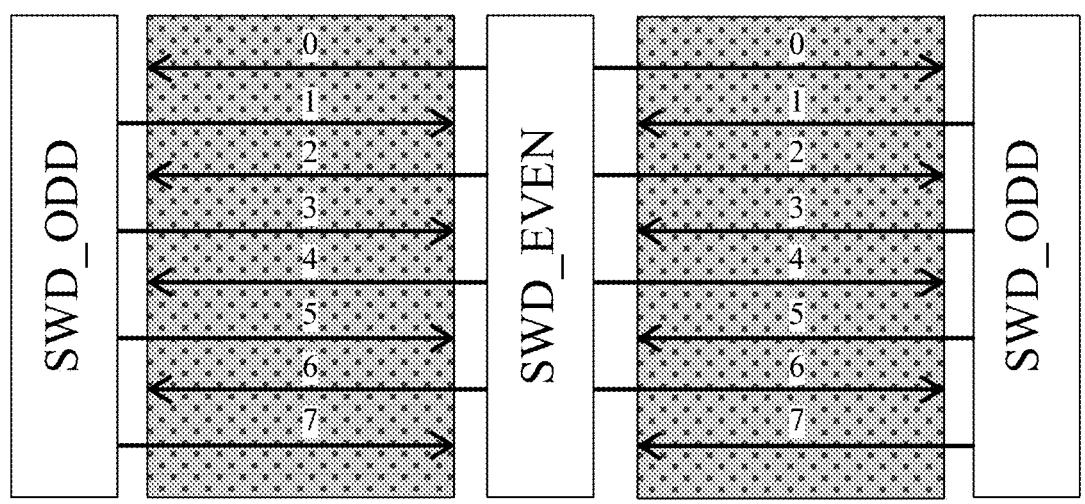
FIG. 1 is a schematic structural diagram of a memory according to an embodiment of the present disclosure.
Figure 2:
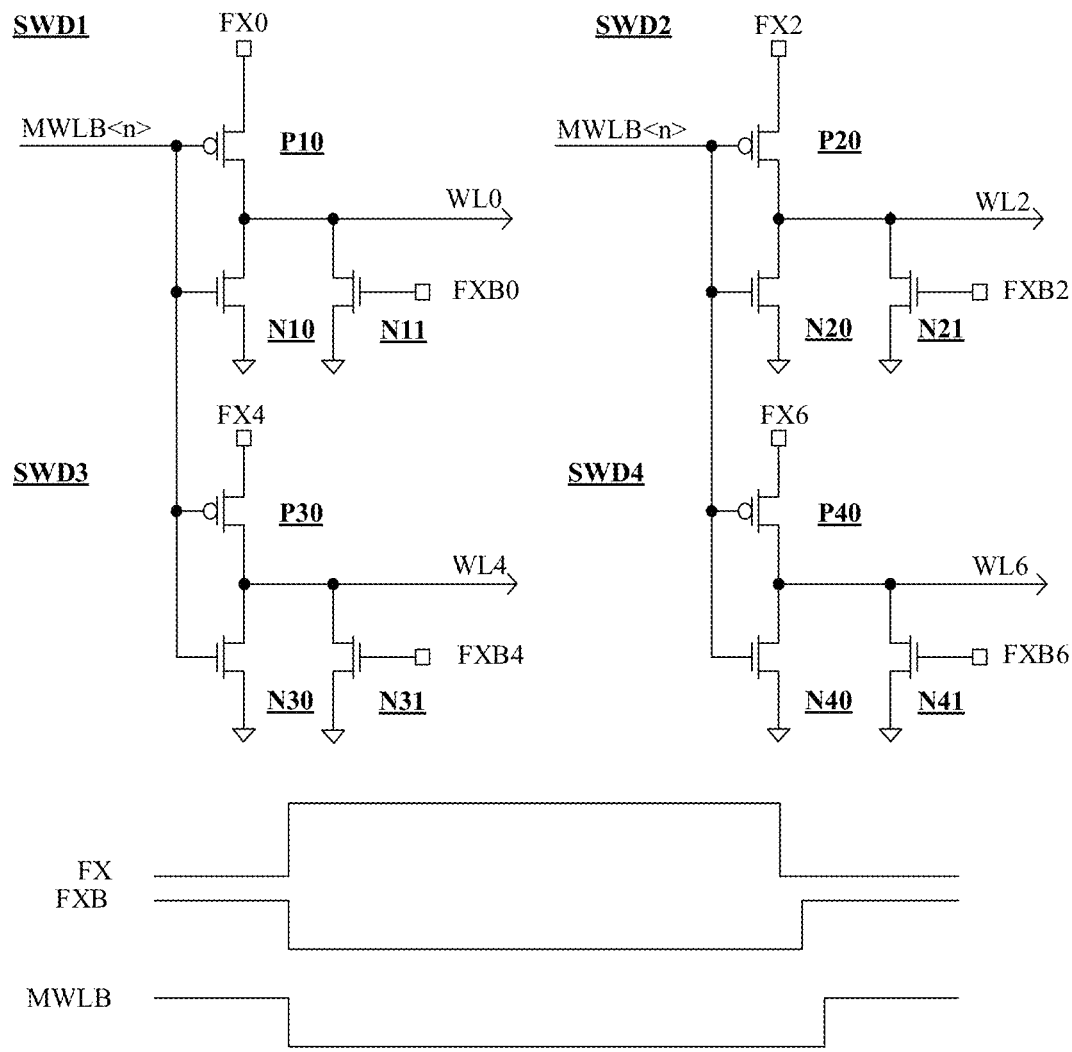
FIG. 2 is a circuit structural diagram of a word line driver circuit according to an embodiment of the present disclosure.

FIG. 1 is a schematic structural diagram of a memory according to an embodiment of the present disclosure. FIG. 2 is a circuit structural diagram of a word line driver circuit according to an embodiment of the present disclosure. FIGS. 3 to 9 are layout structural diagrams of a word line driver circuit according to an embodiment of the present disclosure.

The word line driver circuit includes multiple word line drivers each of which includes a P-channel Metal Oxide Semiconductor (PMOS) transistor and an N-channel Metal Oxide Semiconductor (NMOS) transistor. The multiple word line drivers include multiple PMOS transistors and multiple NMOS transistors. The multiple PMOS transistors are arranged side by side, and in an arrangement direction of the multiple PMOS transistors, a part of the multiple NMOS transistors are located on a side of the multiple PMOS transistors and another part of the multiple NMOS transistors are located on another side of the multiple PMOS transistors.

Embodiments of the present disclosure will be described in more detail below with reference to the accompanying drawings.

Referring to FIG. 1, a word line driver may be classified into an odd word line driver SWD_ODD and an even word line driver SWD_EVEN according to the connected different word lines. The odd word line driver SWD_ODD is used for connecting odd bit word lines (e.g., WL1, WL3, WL5 and WL7) and the even word line driver SWD_EVEN is used for connecting even bit word lines (e.g., WL0, WL2, WL4 and WL6). In a storage device, the odd word line driver SWD_ODD and the even word line driver SWD_EVEN are generally set at intervals, and the odd bit word line and the even bit word line are generally arranged at intervals.

Referring to FIG. 1 and FIG. 2, an example in which each word line driver circuit includes four word line drivers will be described. It can be seen from the figures that different word line drivers in the same word line driver circuit are of the same type. That is, all the word line drivers in the same word line driver circuit are odd word line drivers or even word line drivers. Each of the word line drivers may include one PMOS transistor and two NMOS transistors, denoted as the first PMOS transistor, the first NMOS transistor, and the second NMOS transistor. A gate of the first PMOS transistor and a gate of the first NMOS transistor are used for receiving the first control signal MWLB (e.g., MWLB<n>). A source of the first PMOS transistor is used for receiving the second control signal FX (e.g., FX0, FX2, FX4, and FX6). A drain of the first PMOS transistor, a drain of the first NMOS transistor and a drain of the second NMOS transistor are used for connecting a respective word line (e.g., WL0, WL2, WL4, and WL6). A source of the first NMOS transistor and a source of the second NMOS transistor are grounded. A gate of the second NMOS transistor is used for receiving the second control complementary signal FXB (e.g., FXB0, FXB2, FXB4, and FXB6). In some embodiments, the word line driver includes only one PMOS transistor and one NMOS transistor.

A timing for the second control signal FX to switch to a high level is the same as a timing for the second control complementary signal FXB to switch to a low level and is the same as a timing for the first control signal MWLB to switch to a the low level. A timing for the second control complementary signal FXB to switch to a high level is later than a timing for the second control signal FX to switch to a low level. A timing for the first control signal MWLB to switch to a high level is later than a timing for the second control complementary signal FXB to switch to a high level.

For example, the word line driver circuit includes the first word line driver SWD1, the second word line driver SWD2, the third word line driver and the fourth word line driver SWD4. The first word line driver SWD1 includes a PMOS transistor P10 and NMOS transistors N10 and N11. The second word line driver SWD2 includes a PMOS transistor P20 and NMOS transistors N20 and N21. The third word line driver SWD3 includes a PMOS transistor P30 and NMOS transistors N30 and N31. The fourth word line driver SWD4 includes a PMOS transistor P40 and NMOS transistors N40 and N41. The P10, P20, P30, and P40 are the first PMOS transistors of the first word line driver SWD1, the second word line driver SWD2, the third word line driver SWD3, and the fourth word line driver SWD4, respectively. The N10, N20, N30, and N40 are the first NMOS transistors of the first word line driver SWD1, the second word line driver SWD2, the third word line driver SWD3, and the fourth word line driver SWD4, respectively. The N11, N21, N31, and N41 are the second NMOS transistors of the first word line driver SWD1, the second word line driver SWD2, the third word line driver SWD3, and the fourth word line driver SWD4, respectively.

In some embodiments, each PMOS transistor is composed of at least two sub-PMOS transistors. In other embodiments, each NMOS transistor is composed of at least two sub-NMOS transistors. In still another embodiment, each PMOS transistor is composed of at least two sub-PMOS transistors, and each of the least one NMOS transistor is composed of at least two sub-NMOS transistors. For example, the first PMOS transistor is composed of the first-first PMOS transistor and the first-second PMOS transistor, the first NMOS transistor is composed of the first-first NMOS transistor and the first-second NMOS transistor, and the second NMOS transistor is composed of the second-first NMOS transistor and the second-second NMOS transistor. It should be noted that, in the embodiment of the present disclosure, the first-first PMOS transistor and the first-second PMOS transistor are PMOS transistors with identical physical characteristics, and the difference between the first-first PMOS transistor and the first-second PMOS transistor lies only in their different positions and connection relations with other components. Similarly, the second-first NMOS transistor and the second-second NMOS transistor, and the first-second NMOS transistor and the first-second NMOS transistor are NMOS transistors with identical physical characteristics, and the difference between the —_second-first NMOS transistor, the second-second NMOS transistor, the first-first NMOS transistor and the first-second NMOS transistor lies only in their different positions and connection relations with other components. The arrangement of a PMOS transistor or a NMOS transistor consisting of two sub-MOS transistors facilitates the adjustment of the layout. Wherein at least two sub-PMOS transistors share a same active region; a gate of each of at least two sub-PMOS transistors receives a first control signal, at least two sub-PMOS share a same source for receiving a second control signal, a drain of each of at least two sub-PMOS transistors is connected to a word line. And at least two sub-NMOS transistors share a same active region; a gate of each of at least two sub-NMOS transistors receives the first control signal or a second control complementary signal, a source of each of at least two sub-NMOS transistors is grounded, a drain of each of at least two sub-NMOS transistors is connected to the word line.

For simplicity of illustration, not all transistors or sub-transistors are illustrated in FIGS. 3-9, and those skilled in the art may determine which transistor or sub-transistor is represented by the transistors at different locations in FIGS. 3-9 based on the signals received by the gates, sources and drains of the different transistors illustrated in FIG. 2.

Figure 3:
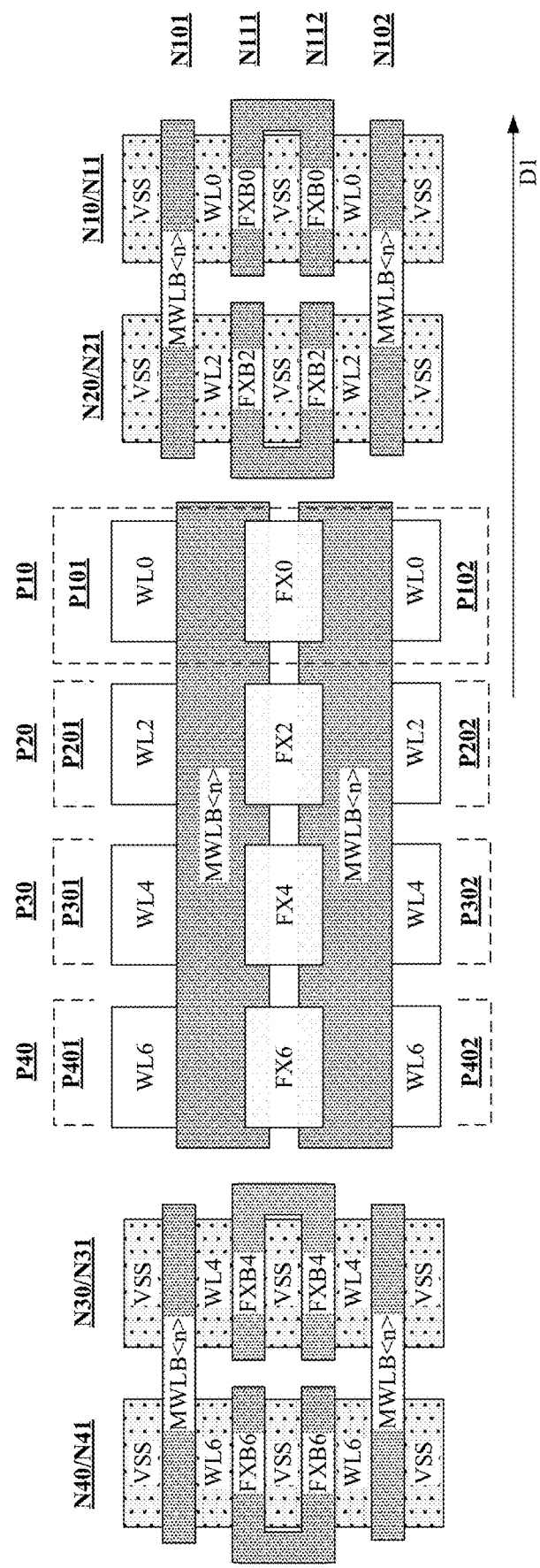
FIG. 3 is a first layout structural diagram of a word line driver circuit according to an embodiment of the present disclosure.

In some embodiments, referring to FIG. 3, the P10 in the first word line driver, the P20 in the second word line driver, the P30 in the third word line driver, and the P40 in the fourth word line driver are arranged side by side along the first direction D1. In the first direction D1, the N10 and the N11 in the first word line driver and the N20 and the N21 in the second word line driver are located on a side of the multiple PMOS transistors, and the N30 and the N31 in the third word line driver and the N40 and the N41 in the fourth word line driver are located on another side of the multiple PMOS transistors.

In some embodiments, a distance between the PMOS transistor and the at least one NMOS transistor in the word line driver is denoted as a preset distance, and preset distances for different word line drivers are the same. Referring to FIG. 3, in the first direction D1, a distance between the first PMOS transistor and the first NMOS transistor and a distance between the first PMOS transistor and the second NMOS transistor in the word line driver are equal. Specifically, a distance between the P10 and the N10 and a distance between the P10 and the N11 are equal, a distance between the P20 and the N20 and a distance between the P20 and N21 are equal, a distance between the P30 and the N30 and a distance between the P30 and N31 are equal, and a distance between the P40 and the N40 and a distance between the P40 and the N41 are equal. Further, the first distance between the P10 and the N10, the second distance between the P20 and the N20, the third distance between the P30 and the N30, and the fourth distance between the P40 and the N40 are equal. Setting preset distances for different word line drivers to be equal facilitates enabling the different word line drivers have the same or similar performance, so that the timings at which the different word line drivers apply the voltage to respective word lines are similar, which ensures the stability of the internal timing of the memory.

In some embodiments, two sub-PMOS transistors share a same source. Taking the first word line driver as an example, the PMOS transistor P10 in the first word line driver is composed of two sub-PMOS transistors P101 and P102, and the P101 and the P102 share the same active region for receiving the first control signal FX, specifically, FX0.

In some embodiments, the arrangement direction (i.e., the first direction D1) of the multiple PMOS transistors is perpendicular to a channel length direction of the PMOS transistors, the arrangement direction of the two sub-PMOS transistors is parallel to the channel length direction of the PMOS transistors and perpendicular to the first direction D1. Continuing with the first word line driver as an example, the arrangement direction of the P101 and the P102 is parallel to the channel length direction and perpendicular to the first direction D1.

In some embodiments, each PMOS transistor includes the first sub-PMOS transistor and the second sub-PMOS transistor, first sub-PMOS transistors corresponding to different PMOS transistors share a same gate, and second sub-PMOS transistors corresponding to different PMOS transistors share a same gate. As illustrated in FIG. 3, PMOS transistor P20 includes P201 and P202, PMOS transistor P30 includes P301 and P302, PMOS transistor P40 includes P401 and P402, P101, P201, P301, and P401 are arranged side by side in first direction D1 and share the same gate, and P102, P202, P302, and P402 are arranged side by side in first direction D1 and share the other gate.

In some embodiments, the second-first NMOS transistor and the second-second NMOS transistor are located between the first-first NMOS transistor and the first-second NMOS transistor. Referring to FIG. 3, the internal arrangements of the NMOS transistors of different word line drivers are the same. For example, in the first word line driver, the first NMOS transistor N10 includes the first-first NMOS transistor N101 and the first-second NMOS transistor N102, and the second NMOS transistor N11 includes the second-first NMOS transistor N111 and the second-second NMOS transistor N112, the N111 and the N112 are located between the N101 and the N102.

In some embodiments, the arrangement direction of the second-first NMOS transistor and the second-second NMOS transistor is parallel to the arrangement direction of the first-first NMOS transistor and the first-second NMOS transistor. Similarly, taking the first word line driver as an example, the arrangement direction of the N111 and the N112 is parallel to the arrangement direction of the N101 and the N102.

In some embodiments, channel length directions of different transistors and channel length directions of sub-transistors of the different transistors are the same, and as such, it is advantageous to achieve a unique preset distance between the PMOS transistor and the NMOS transistor in the same word line driver, and as such, it is advantageous to make the word line driver have more stable and balanced performance. Specifically, taking the first word line driver as an example, in the first direction D1, the distance between the P101 and the N101 is equal to the distance between the P102 and the N102. In the first direction D1, a horizontal position of the gate of the P101 at least partially overlaps with a horizontal position of the gate of the N101, a distance between the P101 and the N101 is the same as the distance between the gate of P101 and the gate of N101, and the same is true between the P102 and the N102, which is not described here for conciseness.

Accordingly, in the first direction D1, the distance between the P101 and the N111 is equal to the distance between the P102 and the N112. In the first direction D1, a horizontal position of the gate of the P101 at least partially overlaps with a horizontal position of the gate of the N111, a distance between the P101 and the N111 is the same as the distance between the gate of the P101 and the gate of the N111, and the same is true between the P102 and the N112, which is not described here for conciseness.

In some embodiments, the first-first NMOS transistor shares the same drain with the second-first NMOS transistor, the second-first NMOS transistor shares the same source with the second-second NMOS transistor, and the second-second NMOS transistor share the same drain with the first-second NMOS transistor. Different transistors sharing the same source or drain may facilitate the reduction of the overall size of the word line driver, and realize the miniaturization and micromation of the word line driver circuits and memories. Taking the first word line driver as an example, the N101 and the N111 share a same active region which is connected to the zeroth word line WL0 through a contact hole, the N111 and the N112 share a same active region which is grounded or connected to a low level signal, the N112 and the N102 share a same active region which is also connected to the zeroth word line WL0 through the contact hole.

The second-first NMOS transistor and the second-second NMOS transistor share a same gate. Sharing the same gate by different transistors reduces the difficulty of fabricating the gate and ensures the conductive performance of the gate. Specifically, the complexity of the patterned opening of the mask can be reduce, so as to avoid etching defects due to the complicated pattern, which ensures that the gate can be effectively formed. Taking the first word line as an example, the N111 and the N112 share a same gate, or the gate of the N111 and the gate of the N112 are different parts of the same conductive layer, and another part of the conductive layer for communicating the gate of the N111 and the gate of the N112 is located on the isolation structure. The isolation structure is used for isolating adjacent active regions. Word lines may be made of doped polysilicon or metal materials, such as tungsten and molybdenum.

Figure 4:
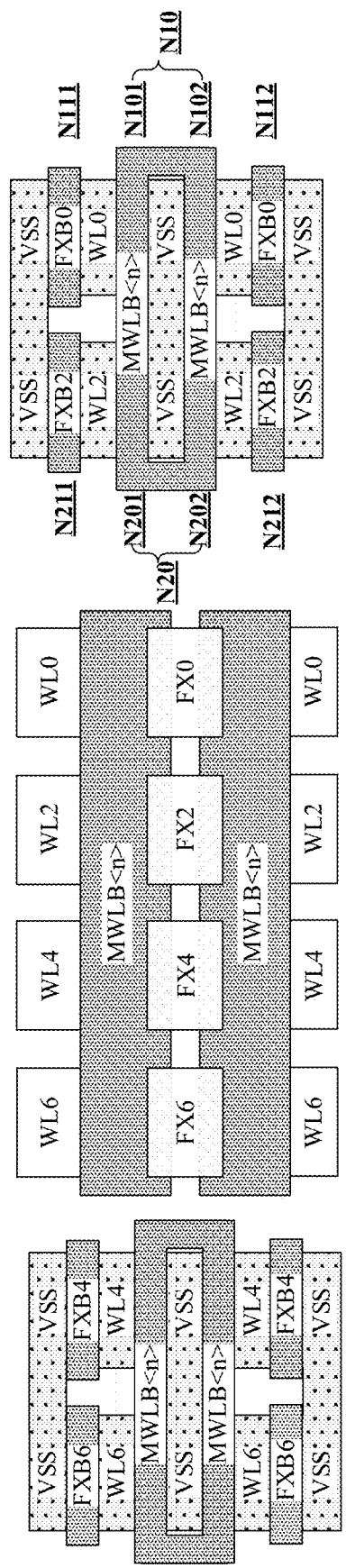
FIG. 4 is a second layout structural diagram of a word line driver circuit according to an embodiment of the present disclosure.

In some embodiments, the first-first NMOS transistor and the first-second NMOS transistor are located between the second-first NMOS transistor and the second-second NMOS transistor. The first-first NMOS transistor and the first-second NMOS transistor may share a same gate. Referring to FIG. 4, the internal arrangements of the NMOS transistors of different word line drivers are the same. Taking the first word line driver as an example, the N101 and the N102 are located between the N111 and the N112, and N101 and N102 share the same gate.

Similarly to the previous embodiment, the arrangement direction of the first-first NMOS transistor and the first-second NMOS transistor located at an intermediate position is parallel to the arrangement direction of the second-first NMOS transistor and the second-second NMOS transistor located at a side position. Referring to FIG. 4, the arrangement direction of the N101 and the N102 is parallel to the arrangement direction of the N111 and the N112.

Accordingly, the second-first NMOS transistor and the first-first NMOS transistor share a same drain, the first-first NMOS transistor and the first-second NMOS transistor share a same source, and the first-second NMOS transistor and the second-second NMOS transistor share a same drain.

Referring to FIG. 4, the N111 and the N101 share a same active region which is connected to the zeroth word line WL0 through the contact hole, the N101 and the N102 share a same active region which is grounded or connected to a low level signal, the N102 and the N112 share a same active region which is also connected to the zeroth word line WL0 through the contact hole.

In some embodiments, referring to FIG. 4, a word line driver includes the first word line driver and the second word line driver, and an NMOS transistor N10 in the first word line driver shares a same source and a same gate with an NMOS transistor N20 in the second word line driver. The N20 is composed of the N201 and the N202, the N10 is composed of the N101 and the N102, and the N201, the N202, the N101 and the N102 share a same continuous active region and a same continuous conductive layer. It will be appreciated that gates of different transistors are different parts of the same conductive layer, and other parts of the conductive layer connecting the gates of the different transistors are located on an isolation structure, the isolation structure is used for isolating adjacent active regions. In addition, the shared continuous conductive layer may have various shapes depending on the arrangement of the transistors. In some embodiments, the shared continuous conductive layer may have a ring shape.

Accordingly, the second NMOS transistor included in the first word line driver shares a source with the second NMOS transistor included in the second word line driver. The second NMOS transistor in the first word line driver is composed of the N111 and the N112, the second NMOS transistor in the second word line driver is composed of the N111 and the N112, the N111 and the N211 share a same source, and the N112 and the N212 share a same source.

It is to be understood that there are various combinations between different word line drivers, and embodiments of the present disclosure show an example in which the NMOS transistors of the first word line driver and the second word line driver are arranged on the same side of the PMOS transistor, and the connection relationship of the NMOS transistors of adjacent word line drivers located on the same side of the PMOS transistor in the word line driver circuit is explained based on the example. It is appreciated that in the embodiment illustrated in FIG. 4, the NMOS transistor of the third word line driver and the NMOS transistor of the fourth word line driver are equally applicable to the above-described connection relationship. Similarly, in other embodiments, if the NMOS transistor of the first word line driver and the NMOS transistor of the third word line driver are located on a side of the PMOS transistor, the above-described connection relationship is also applicable to the NMOS transistor of the first word line driver and the NMOS transistor of the third word line driver. Subsequently, the first word line driver and the second word line driver are still described as examples, and details are not described as to their application.

In some embodiments, the arrangement directions of the second-first NMOS transistor and the second-second NMOS transistor are parallel to the arrangement directions of the first-first NMOS transistor and the first-second NMOS transistor. The first-first NMOS transistor and the first-second NMOS transistor share a same gate, and/or the second-first NMOS transistor and the second-second NMOS transistor share a same gate.

Figure 5:
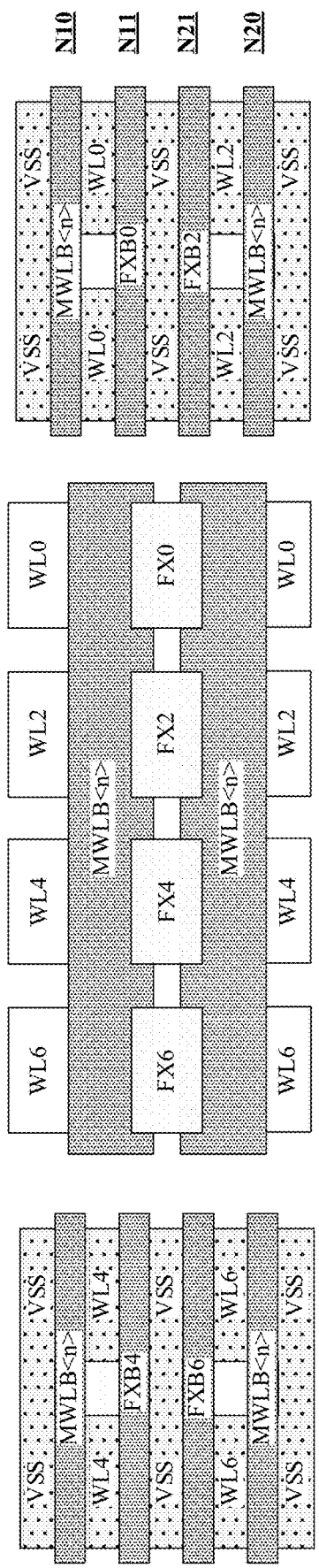
FIG. 5 is a third layout structural diagram of a word line driver circuit according to an embodiment of the present disclosure.

In some embodiments, referring to FIG. 5, the word line driver includes the first word line driver and the second word line driver, and the second NMOS transistor included in the first word line driver and the second NMOS transistor included in the second word line driver are located between the first NMOS transistor included in the first word line driver and the first NMOS transistor included in the second word line driver, i.e., the N11 and the N21 are located between the N10 and the N20.

Figure 6:
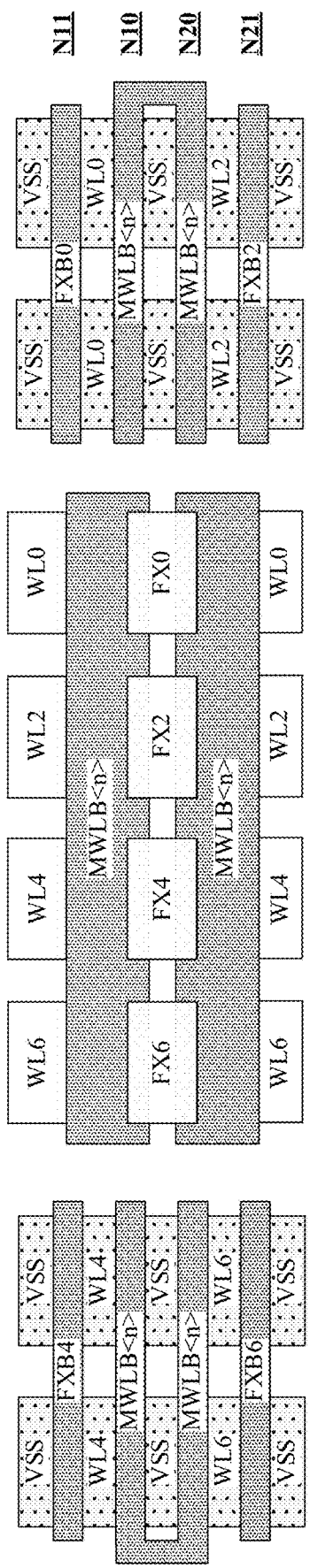
FIG. 6 is a fourth layout structural diagram of a word line driver circuit according to an embodiment of the present disclosure.

In other embodiments, referring to FIG. 6, the word line driver includes the first word line driver and the second word line driver, the first NMOS transistor included in the first word line driver and the first NMOS transistor included in the second word line driver are located between the second NMOS transistor included in the first word line driver and the second NMOS transistor included in the second word line driver, i.e., the N10 and the N20 are between the N11 and the N21. In addition, the N10 and the N20 share a same gate.

Figure 7:
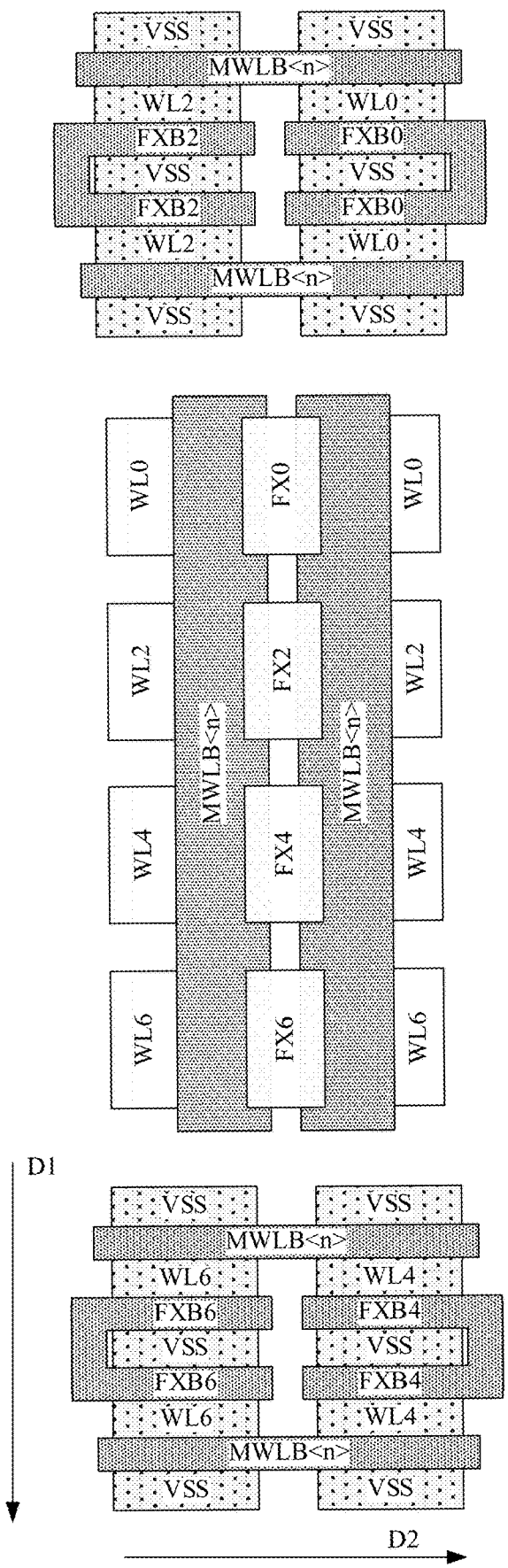
FIG. 7 is a fifth layout structural diagram of a word line driver circuit according to an embodiment of the present disclosure
Figure 8:
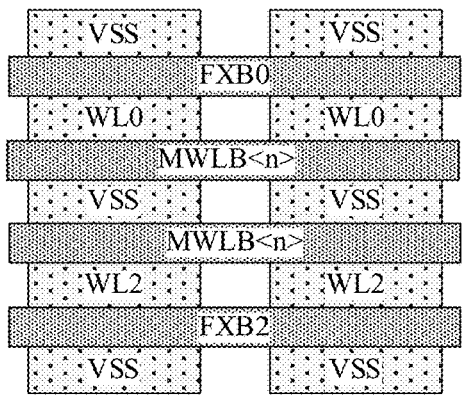
FIG. 8 is a sixth layout structural diagram of a word line driver circuit according to an embodiment of the present disclosure.
Figure 8:
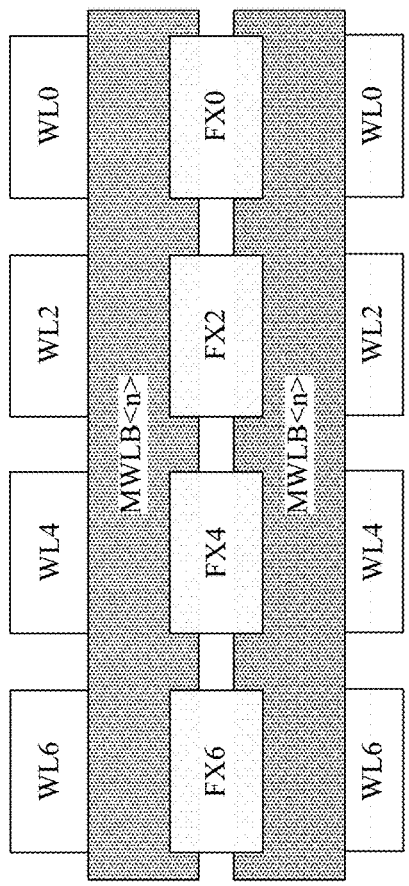
Figure 8:
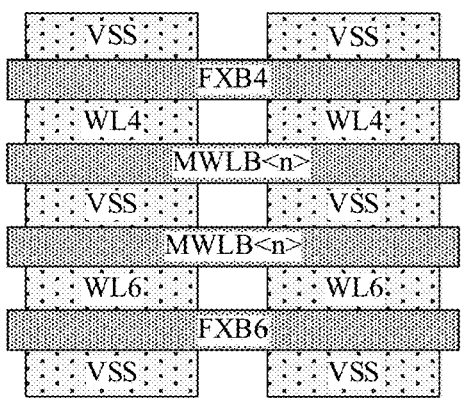
Figure 9:
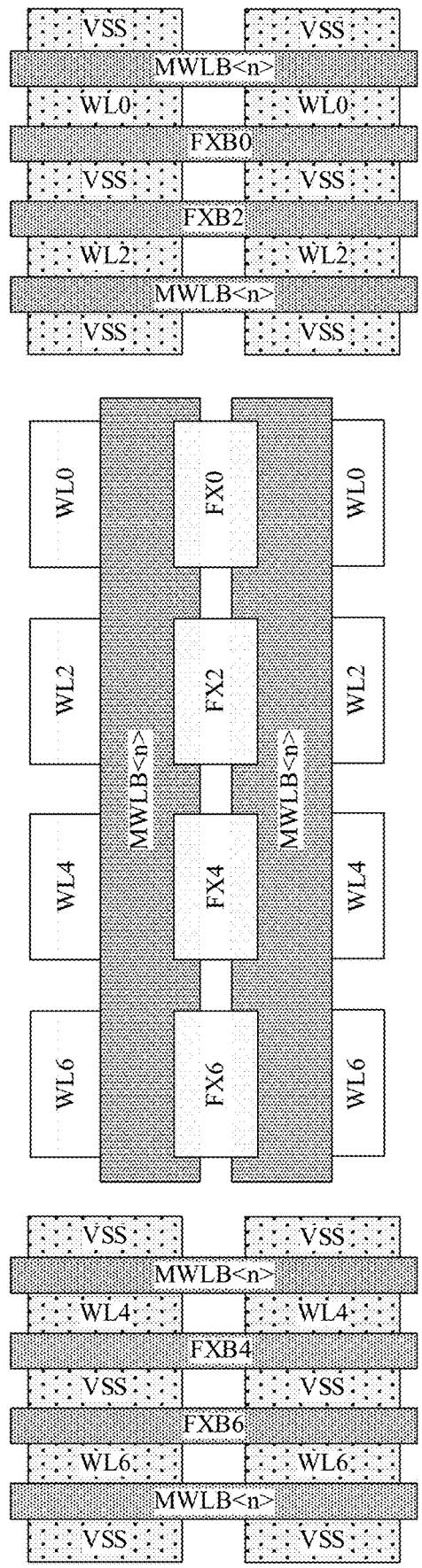
FIG. 9 is a seventh layout structural diagram of a word line driver circuit according to an embodiment of the present disclosure.

In some embodiments, referring to FIGS. 3 to 6, in the word line driver, the channel length direction of the NMOS transistor is parallel to the channel length direction of the PMOS transistor, or the channel length direction of the PMOS transistor is the same as the channel length direction of the NMOS transistor. In other embodiments, referring to FIGS. 7 to 9, the channel length direction of the NMOS transistor in the word line driver is perpendicular to the channel length direction of the PMOS transistor. The embodiment illustrated in FIG. 7 is different from the embodiment illustrated in FIG. 3 in that the channel length direction of the NMOS transistor in the word line driver circuit is adjusted as a whole. Accordingly, the same is true to main difference between the embodiment illustrated in FIG. 8 and the embodiment illustrated in FIG. 6 and main difference between the embodiment illustrated in FIG. 9 and the embodiment illustrated in FIG. 5.

Since a extending direction of the word line connected to the word line driver is generally parallel to a extending direction of the gate of the PMOS transistor in the word line driver, the channel length direction of the NMOS transistor is arranged to be perpendicular to the channel length direction of the PMOS transistor, a situation that a large number of NMOS transistors are arranged side by side in the second direction D2 perpendicular to the first direction D1 is avoided, and more space is reserved for the extending of the drain of the NMOS transistor, so that the drain of the NMOS transistor has a larger width, so that the word line extending from the drain of the PMOS transistor can be directly connected to the drain of the respective NMOS transistor without bending, that is, the word line appears straight, the resistance of the word line and Resistance-Capacitance (RC) delay caused by the resistance are reduced, and it ensures that the word line driver circuit has good electrical performance.

In embodiments of the present disclosure, multiple PMOS transistors are arranged side by side, and in the arrangement direction of the multiple PMOS transistors, multiple NMOS transistors are located on two sides of the multiple PMOS transistors. In this way, side by side arrangement of the PMOS transistor and the NMOS transistor in the direction perpendicular to the above mentioned arrangement direction is avoided, so that the PMOS transistor and the NMOS transistor have a larger space in the vertical direction, thereby facilitating extension of the channel length or gate width of the PMOS transistor and the NMOS transistor, and improving the electrical performance of the word line driver circuit. Also, controlling the NMOS transistor to be located on two sides of the PMOS transistor is advantageous in making the distances between the PMOS transistor and the NMOS transistor corresponding to different word line drivers shorter, thereby shortening the wiring length, reducing the wire resistance and reducing the signal delay. In addition, the arrangement of the NMOS transistor on two sides of the PMOS transistor facilitates the improvement of the symmetry of the word line driver circuit, and thus the electrical performance of the word line driver circuit is improved.

Embodiments of the present disclosure further provide a memory including any one of the above mentioned word line driver circuits. In the case where the size of the integrated circuit is increasingly miniaturized, the word line driver circuit employing the above-described structure can have good characteristics because its transistors and word lines can have good electrical performance, thereby improving the overall performance of the memory.

It will be understood by those of ordinary skill in the art that the above embodiments are specific embodiments for realizing the present disclosure, and in practical application, various changes may be made in form and detail without departing from the spirit and scope of the present disclosure. Any person skilled in the art may make changes and modifications without departing from the spirit and scope of the present disclosure, and therefore the scope of protection of the present disclosure shall be subject to the scope defined by the claims.

What is claimed is:

1. A word line driver circuit, comprising:
a plurality of word line drivers, each word line driver comprising a P-channel Metal Oxide Semiconductor (PMOS) transistor and at least one N-channel Metal Oxide Semiconductor (NMOS) transistor, the plurality of word line drivers comprising a plurality of PMOS transistors and a plurality of NMOS transistors, the plurality of PMOS transistors being arranged side by side, and in an arrangement direction of the plurality of PMOS transistors, a part of the plurality of NMOS transistors being located on a side of the plurality of PMOS transistors, and another part of the plurality of NMOS transistors being located on another side of the plurality of PMOS transistors.

2. The word line driver circuit of claim 1, wherein a distance between the PMOS transistor and the at least one NMOS transistor in the word line driver is a preset distance, and preset distances for different word line drivers are the same.

3. The word line driver circuit of claim 1, wherein each PMOS transistor is composed of at least two sub-PMOS transistors;
wherein at least two sub-PMOS transistors share a same active region; a gate of each of at least two sub-PMOS transistors receives a first control signal, at least two sub-PMOS share a same source for receiving a second control signal, a drain of each of at least two sub-PMOS transistors is connected to a word line.

4. The word line driver circuit of claim 3, wherein each of the at least one NMOS transistor is composed of at least two sub-NMOS transistors;
wherein at least two sub-NMOS transistors share a same active region; a gate of each of at least two sub-NMOS transistors receives the first control signal or a second control complementary signal, a source of each of at least two sub-NMOS transistors is grounded, a drain of each of at least two sub-NMOS transistors is connected to the word line.

5. The word line driver circuit of claim 4, wherein the word line driver comprises a first PMOS transistor, a first NMOS transistor, and a second NMOS transistor, wherein a gate of the first PMOS transistor receives the first control signal, a source of the first PMOS transistor receives the second control signal, a drain of the first PMOS transistor is connected to the word line, a gate of the first NMOS transistor receives the first control signal, a source of the first NMOS transistor is grounded, a drain of the first NMOS transistor is connected to the word line, a gate of the second NMOS transistor receives the second control complementary signal, a source of the second NMOS transistor is grounded, a drain of the second NMOS transistor is connected to the word line, the first NMOS transistor is composed of a first-first second NMOS transistor and a first-second NMOS transistor, and the second NMOS transistor is composed of a second-first NMOS transistor and a second-second NMOS transistor.

6. The word line driver circuit of claim 5, wherein the second-first NMOS transistor and the second-second NMOS transistor are located between the first-first NMOS transistor and the first-second NMOS transistor.

7. The word line driver circuit of claim 6, wherein an arrangement direction of the second-first NMOS transistor and the second-second NMOS transistor is parallel to an arrangement direction of the first-first NMOS transistor and the first-second NMOS transistor.

8. The word line driver circuit of claim 6, wherein the first-first NMOS transistor and the second-first NMOS transistor share a same drain, the second-first NMOS transistor and the second-second NMOS transistor share a same source, and the second-second NMOS transistor and the first-second NMOS transistor share a same drain.

9. The word line driver circuit of claim 8, wherein the second-first NMOS transistor and the second-second NMOS transistor share a same gate.

10. The word line driver circuit of claim 5, wherein the first-first NMOS transistor and the first-second NMOS transistor are located between the second-first NMOS transistor and the second-second NMOS transistor.

11. The word line driver circuit of claim 10, wherein the first-first NMOS transistor and the first-second NMOS transistor share a same gate.

12. The word line driver circuit of claim 10, wherein the word line driver comprises a first word line driver and a second word line driver, the first NMOS transistor comprised in the first word line driver and the first NMOS transistor comprised in the second word line driver share a same source and a same gate, and the second NMOS transistor comprised in the first word line driver and the second NMOS transistor comprised in the second word line driver share a source.

13. The word line driver circuit of claim 5, wherein an arrangement direction of the second-first NMOS transistor and the second-second NMOS transistor is parallel to an arrangement direction of the first-first NMOS transistor and the first-second NMOS transistor.

14. The word line driver circuit of claim 13, wherein the first-first NMOS transistor and the first-second NMOS transistor share a same gate, and the second-first NMOS transistor and the second-second NMOS transistor share a same gate.

15. The word line driver circuit of claim 13, wherein the word line driver comprises a first word line driver and a second word line driver, and the second NMOS transistor comprised in the first word line driver and the second NMOS transistor comprised in the second word line driver are located between the first NMOS transistor comprised in the first word line driver and the first NMOS transistor comprised in the second word line driver.

16. The word line driver circuit of claim 13, wherein the word line driver comprises a first word line driver and a second word line driver, the first NMOS transistor comprised in the first word line driver and the first NMOS transistor comprised in the second word line driver are located between the second NMOS transistor comprised in the first word line driver and the second NMOS transistor comprised in the second word line driver.

17. The word line driver circuit of claim 1, wherein a channel extending direction of the at least one NMOS transistor is perpendicular to a channel extending direction of the PMOS transistor.

18. A memory, comprising a word line driver circuit, wherein the word line driver circuit comprises:
a plurality of word line drivers, each word line driver comprises a P-channel Metal Oxide Semiconductor (PMOS) transistor and at least one N-channel Metal Oxide Semiconductor (NMOS) transistor, the plurality of word line drivers comprise a plurality of PMOS transistors and a plurality of NMOS transistors, the plurality of PMOS transistors are arranged side by side, and in an arrangement direction of the plurality of PMOS transistors, a part of the plurality of NMOS transistors are located on a side of the plurality of PMOS transistors, and another part of the plurality of NMOS transistors are located on another side of the plurality of PMOS transistors.

19. The memory of claim 18, wherein a distance between the PMOS transistor and the at least one NMOS transistor in the word line driver is a preset distance, and preset distances for different word line drivers are the same.

20. The memory of claim 18, wherein each PMOS transistor is composed of at least two sub-PMOS transistors;
wherein at least two sub-PMOS transistors share a same active region; a gate of each of at least two sub-PMOS transistors receives a first control signal, at least two sub-PMOS share a same source for receiving a second control signal, a drain of each of at least two sub-PMOS transistors is connected to a word line.

* * * * *